United States Patent [19]
Fawcett

[11] Patent Number: 5,546,344
[45] Date of Patent: Aug. 13, 1996

[54] EXTENDED DATA OUTPUT DRAM INTERFACE

[75] Inventor: Andrew R. Fawcett, Los Altos Hills, Calif.

[73] Assignee: Cirrus Logic, Inc., Fremont, Calif.

[21] Appl. No.: 466,629

[22] Filed: Jun. 6, 1995

[51] Int. Cl.⁶ .................................................. G11C 7/00
[52] U.S. Cl. ...................... 365/189.05; 365/194; 365/233
[58] Field of Search ............................. 365/189.05, 193, 365/194, 233, 238.5

[56] References Cited

U.S. PATENT DOCUMENTS

| | | | |
|---|---|---|---|
| 4,727,363 | 2/1988 | Ishii | 340/724 |
| 4,806,921 | 2/1989 | Goodman et al. | 340/747 |
| 4,991,110 | 2/1991 | Hannah | 364/518 |
| 5,159,683 | 10/1992 | Lvovsky et al. | 395/500 |
| 5,325,330 | 6/1994 | Morgan | 365/189.05 |
| 5,349,566 | 9/1994 | Merritt et al. | 365/189.05 X |
| 5,373,323 | 12/1994 | Kwon | 348/448 |
| 5,379,261 | 1/1995 | Jones, Jr. | 365/230.01 |
| 5,392,239 | 2/1995 | Margulis et al. | 365/189.01 |
| 5,412,777 | 5/1995 | Wakimoto | 395/166 |
| 5,436,865 | 7/1995 | Kitazawa | 365/194 |
| 5,457,659 | 10/1995 | Schaefer | 365/189.05 X |

OTHER PUBLICATIONS

"Micron Semiconductor, Inc." MT4C16270 256K×16 Wide Fast Page Mode With Extended Data–Out, Nov. 1993.
"Paradise Systems, Inc." PEGA 1 Advanced Video Controller Advance Information, Jan. 1986.

*Primary Examiner*—Joseph A. Popek
*Attorney, Agent, or Firm*—Robert Platt Bell & Associates, P.C.

[57] ABSTRACT

A DRAM interface, particularly for use in a video controller IC is provided with an improved technique for latching data from an extended data output (EDO) DRAM. An inactive column select CASn signal is fed back through the output of the DRAM interface, along with a write enable signal WEn, to emulate delays of such signals within the extended data output DRAM and the DRAm controller. The inactive CASn signal and write enable signal WEn are ANDed together to produce an ENABLE signal for latching data in a transparent latch. The use of the ENABLE signal optimizes the performance of the EDO DRAM and prevents collision of read and write data.

17 Claims, 7 Drawing Sheets

EXTENDED DATA OUTPUT DRAM INTERFACE

FIELD OF THE INVENTION

The present invention is directed toward an interface for a DRAM, particularly a DRAM having a high bandwidth data output (e.g., extended data output). The present invention has particular application to a video controller using high resolution video modes.

BACKGROUND OF THE INVENTION

In computer systems, it may be desirable to optimize the performance of dynamic random access memory (DRAM) both within the main system and in computer subsystems. For example, as illustrated in FIG. 1B, a display subsystem for an IBM™ compatible PC or the like may basically comprise a controller chip 100 (i.e., video controller IC) including DRAM interface 120, DRAM memory device(s) 130, memory data and control bus 140, and system interface to a standard interface bus, for example VESA Local Bus (VL) or Peripheral Component Interconnect Bus (PCI). For a display subsystem, the cost of DRAM 130 may typically reflect ½ to ⅔ of the total bill of materials for the overall display subsystem. Thus, it may be essential to use available DRAM effectively. If a system design uses more expensive DRAMs, a customer may expect a corresponding increase in performance.

Although illustrated here as a DRAM interface 120 for a video controller 100, the principles of the present invention may be applied to other types of processor systems and subsystems where memories (e.g., DRAMS) and DRAM interfaces are used, including but not limited to hard and floppy disk drive controllers (HDD and FDD), I/O devices, and central processing units (CPUs). The illustration of the background art and the present invention as pertaining to video controllers is for the purposes of illustration only and not intended to limit the spirit or scope of the present invention.

Maximizing the performance of DRAM 130 may be especially important in high performance video controllers using a block transfer unit or "blitter". A block transfer unit (BLT) may program a rectangular space in memory to be moved from one location to another, possibly manipulating the data in some logical operation with the data at the destination to be written. For example, an OR operation may be performed to keep a graphical image as a background. Some block transfers, to be used effectively, may require high speed data transfer modes such as fast page or extended data output modes of the DRAM.

DRAM interface 120 should be able to handle the peak bandwidth of a given DRAM 130. For a video controller, higher data bandwidth may allow for higher resolution video modes, both in terms of pixel resolution (the number of pixels displayed across the screen and the number of lines of pixels displayed), and pixel depth (the number of unique colors which may be displayed concurrently). In addition, higher data bandwidth may allow a video display to be changed rapidly, for example, for motion video or the like.

Peak bandwidth in DRAM 130 may be directly related to the column address strobe (CASn) rate. There are a common set of control signals within memory control and data bus 140 to DRAM 130 which may comprise a single port, multiplexed address device. In other words, in order to specify a single location in DRAM 130, DRAM interface 120 may first send to DRAM 130 a row address, strobe the row address with the Row Address Strobe (RASn), then send a column address and strobe that address with CASn. Video controller 100 may grant bandwidth to a number of specific processes including, for example, screen refresh, CPU access, and block transfer processing of memory contents.

Fast page and extended data output modes may allow DRAM interface 120 to supply DRAM 130 with one row address, followed by many column addresses. Overhead (the extra time taken) needed to locate a new row may be two to three times that needed to access an individual column within a row. Thus, peak bandwidth may be directly proportional to CASn rate (that is, once a particular row has been located, we may rapidly access column data within it).

Another issue DRAM interface 120 may deal with is average data bandwidth. Average data bandwidth may be essentially peak bandwidth less time spent on overhead, i.e., setting up row addresses, changing data transfer ,direction and idle time. Average bandwidth considerations may be addressed by providing deep storage within DRAM controller 120. For example, video controller IC 100 may be provided with a FIFO of 28 levels by 64 bits to store data to be displayed on a display 150. In addition, memory accesses may go through another FIFO storing system address and data which may subsequently be analyzed to determine which adjacent accesses are to the same row and could therefore take advantage of fast page mode. A FIFO (First In-First Out), also known as a Queue, may be implemented as a dual port (concurrent read and write) circular store. It may be used to effectively de-couple the rate at which data can be read or written from or to the DRAM from the rate at which that data can be used or supplied. To further increase average bandwidth, row address overhead time and memory data bus turn-around time may each be programmable in DRAM interface 120 to match the spec of a particular DRAM 130.

FIG. 1A illustrates a timing diagram of a prior art DRAM interface 120 executing a mixed fast page mode with two read cycles and two write cycles. Each signal illustrated represents a signal or group of signals executed between DRAM interface 120 and DRAM 130 over memory control and data bus 140. At the bottom of FIG. 1A, each portion of a fast page mode read and write cycle 30 is identified.

At the top of FIG. 1A is illustrated the memory clock signal MCK. Memory clock may comprise a system or CPU clock or device clock, or may be derived or independently generated depending upon application. For a video controller, MCK may be independently generated.

Row address strobe RASn indicates the presence of a valid row address during the Row Address Setup portion of a read/write cycle. When a valid row address is present, signal RASn goes low. Column address strobe CASn indicates the presence of a valid column address. When a valid column address is present, signal CASn goes low.

During a subsequent read cycle, column address strobe CASn may go low when a valid column address is present. With the Write Enable WEn signal inactive (high) CASn going active (low) will cause the DRAM to drive data onto the memory data (MD) portion of memory control and data bus 140 (Indicated in FIG. 1A by the signal $MD_{DRAMout}$), and latched by DRAM interface 120. When CASn goes high this causes the DRAM to enter a tri-state or high impedance state indicated in FIG. 1A by the center level with the "Z" superimposed (i.e., the DRAM stops driving data onto the MD bus at this time—and this is the time to close the latch receiving that data). Memory data portion of memory control and data bus 140 may be any number of bits wide, however in the preferred embodiment, memory data portion of memory control and data bus 140 may be 64 bits wide.

Note that the memory control and data bus 140 is a bi-directional bus—that is it may be used for transfer of data from or to the memory. FIG. 1A represents the individual contributions of DRAM 130 and video controller 100 on memory data portion MD of memory control and data bus 140 using a subscript notation $MD_{DRAMout}$ and $MD_{CONTROLLERout}$. The actual state of the physical connection MD may be derived as the logical OR of these two contributions (that is the active value being driven from either one, or, if neither is driving then the bus is said to be 'floating').

During a subsequent write cycle, Write Enable signal WEn goes low, and data is driven from video controller 100 onto MD as indicated in FIG. 1A in signal MDCONTROLLERout. This data is written to column address indicated by CASn. A small amount of time (e.g., one MCK cycle) may be required as turn-around time to switch from read to write mode.

The timing diagram of FIG. 1A illustrates a conventional DRAM interface 120 executing fast page mode read and write cycles. It is considered fast page mode as there is more than one CASn cycle per RASn cycle. In practice, the number of CASn cycles which may be executed in a single RASn cycle may be limited by several factors which may necessitate generation of a new row address.

First, the amount of storage available to latch data read from DRAM may be limited. Thus, for example, if an eight level FIFO is provided to store data read from DRAM a maximum of eight CASn cycles maybe possible in order to prevent FIFO overflow (i.e., new data from DRAM overwriting old data which has not been used yet).

Second, only a certain amount of data may be requested as in the case of a random CPU request. If only four bytes of data are requested, they may be read from memory with a single RASn, and CASn cycle. In the case of CPU write requests, consecutive requests may not be to memory locations which are in the same Row of memory (sometimes a row of memory is referred to as a Page and the requirement to specify a new page, by sending a new row address and strobing it with RASn, is referred to as a Page Break).

Third the amount of data available to write may be limited when in write mode. If a write is made for a CPU request or Block Transfer Unit ("blitter"), eventually the data to be written will end, forcing an end to the write cycle.

Fourth, even if there is adequate storage available for the screen refresh process, for example, there may be a page break necessitating a new row address and Row Address Strobe.

In general it may be preferable to remain in page mode for as long as possible to amortize the row address setup period over a longer number of cycles. With regard to peak bandwidth, the fast page mode CASn cycle time may be derived in a DRAM interface 120 from internal memory clock MCK which may be programmable to match closely the specification of a wide range of DRAMs, allowing each to operate at its maximum potential. Typically a CASn cycle may comprise two MCK cycles.

CASn signals (one for each byte of memory) may be driven out of DRAM interface 120 on MCK timing to DRAM 130. This enables DRAM 130 to drive data onto memory data portion MD of memory control and data bus 140 as indicated in signal MDDRAMoutin FIG. 1A. There may be a finite delay within DRAM 130 between the time signal CASn goes low and data is driven out on MD. Furthermore, a finite delay may occur within DRAM interface 120 in driving signal CASn to DRAM 130.

When DRAM 130 does output data onto MD, data may pass back to DRAM interface 120 and be latched, typically by a so-called transparent latch. A transparent latch may be provided with a gate input G. While gate input G is high, data is being continually written into the transparent latch. When gate input G goes low, whatever data was present prior to this transition is latched in the transparent latch.

Delays between the assertion of the CASn signal and output of data on memory data portion MD of memory control and data bus 140 (as indicated in FIG. 1A by $MD_{DRAMout}$) may take a certain amount of time which a DRAM interface designer may not have absolute control over. Such delays may vary with temperature, voltage, semiconductor manufacturing process variations, DRAM manufacturer, circuit design, or the like. A semiconductor circuit designer designing a DRAM interface may have to take into account these factors to ensure that data is successfully retrieved from DRAM 130 in the least amount of time.

One prior art solution to this problem is to feed back the CASn signal into DRAM interface 120 to emulate delays within DRAM 130 and DRAM interface 120. FIG. 1C illustrates a portion of the circuitry of DRAM interface 120 of FIG. 1B implementing a prior art solution. As illustrated in FIG. 1C, DRAM 130 may output memory data onto MD (shown as $MD_{DRAMout}$) to DRAM interface 120 where it is passed through a pad 121 and input pad driver 122, through multiplexer 123, and fed to transparent latch 124. Pad 121 may represent a contact pad on a semiconductor device. Input pad driver 122 may comprise a device translating external logic voltage levels to those used within the semiconductor device.

Control logic 131 driven by memory clock MCK derives signal CASn as discussed above. Signal CASn is then passed through output pad driver 129 and pad 125 and output to DRAM 130. Pad 125 may comprise a bi-directional pad provided with both output pad driver 129 and input pad driver 126. Signal CASn is fed back through input pad driver 126 to multiplexor 127 through AND gate 128 to gate G of transparent latch 124. Fed-Back Signal CASn thus is delayed by an amount similar to delays induced within DRAM interface 120 and DRAM 130.

Fed-back Signal CASn acts as a write enable signal to transparent latch 124 such that data output from DRAM 130 may be latched in latch 124 at an appropriate time. Fed-back Signal CASn may be ANDed with selection signal SELECTION in AND gate 128 to choose one of many latches 124 each storing data for a different purpose. For example, transparent latch 124 may comprise one element of a FIFO, for example a 28 level FIFO. Twenty-eight levels of the FIFO may need to be loaded sequentially, and signal SELECTION may select a proper transparent latch 124 for a particular FIFO level.

By making the delay paths of fed-back CASn and MD similar, the uncertainty of the delays produced in the system may be eliminated or reduced. Whether the system delays are long or short (e.g. due to temperature, voltage, external board loading, IC manufacturing process variations or the like) may be largely irrelevant, as the fed-back CASn is similarly delayed to drive transparent latch 124. This delay scheme was used by Paradise Systems, Inc., in the PEGA 1 video controller IC, described in the Paradise Systems, Inc. PEGA 1 Advanced Video Controller Advance Information, dated January 1986 and incorporated herein by reference.

One alternative to using the technique of FIG. 1C would be to slow down the memory data retrieval process to the point where under all worse case conditions (e.g., due to temperature, voltage, external board loading, IC manufacturing process, or the like) Memory Data would be validly latched in transparent latch 124 on fixed timing derived from MCK. Unfortunately, such a technique may not optimize performance of a high performance DRAM using fast page mode or extended data out.

Another issue with regard to DRAM interface 120 is pin count. As in any integrated circuit (IC) design, it may be desirable to minimize pin count to reduce package size and cost, as well as reduce the complexity of implementing the IC in a circuit design. One common DRAM organization for graphics applications is 256K×16 with two (2) CASn signals (one for each byte) and a common output enable signal OEn and write enable signal WEn. By using "early write" timing, illustrated in FIG. 1A, in which a write to the memory is executed when signal WEn goes active (low) before the leading (falling) edge of CASn strobes the column address of the location to be written, it may not be necessary to connect DRAM output enable pin OEn to DRAM interface 120.

The falling edge of signal CASn is the event which may strobe data $MD_{DRAMout}$. Output enable pin OEn may be grounded and write enable signal WEn may signal the direction of transfer to or from DRAM 130. FIG. 1D illustrates a detail of the timing diagram of FIG. 1A. As illustrated in FIG. 1D, row address strobe RASn goes low when a valid row address is asserted to DRAM 130. Output enable pin OEn may be grounded to continually enable output from DRAM 130. When write enable signal WEn is high, writing to DRAM 130 is disabled, and on the falling edge of signal CASn, a read cycle is initiated resulting in the output of data MDDRAMout, after a finite delay. If signal WEn goes low, any subsequent CASh signal is treated as a write request.

DRAM output enable pin OEn may be grounded and then the write enable signal WEn may indicate the required direction of transfer of data to or from DRAM 130. When write enable signal WEn is high, writing to DRAM 130 is disabled. If signal WEn goes low, any subsequent CASn signal is treated as a write request (so the DRAM will not drive MD at that time). Such a technique may save one pin in a video controller design which in turn may be used to control a second bank of DRAMs (not shown).

High performance DRAMs are available with the so-called extended data output mode (EDO) which is also known as Hyper-Page mode. An example of such an EDO DRAM is the MT4C16270 by Micron Semiconductor, Inc., of Boise, Id. FIG. 1E illustrates a detail of a timing diagram for an EDO DRAM interface. For the purposes of illustration, the timing diagram of FIG. 1E will be discussed in connection with the block diagrams and schematics of FIG. 1B and 1C, where, in this instance, DRAM 130 comprises an EDO DRAM.

An EDO DRAM interface differs from a fast page mode DRAM interface as follows. During a read cycle, DRAM 130 continues to drive memory data bus after CASn has gone inactive (i.e., CASn goes high), as illustrated in FIG. 1E. By continuing to drive data out after CASn has gone inactive, a faster CASn cycle time may be allowable, as the need to wait for CASn access time from when signal CASn becomes active (i.e., falling edge) before taking CASn inactive may be eliminated (this is a limitation of a conventional DRAM interface).

EDO DRAM 130 may specify a data hold time with respect to the leading edge of the next CASn. This specified data hold time may be used to feed back the inactive CASn pulse between two read cycles and use it as a write enable signal for a transparent latch 124 within DRAM interface 120 designed to accept the read data from the first read cycle of each pair.

Some prior art DRAM interfaces may attempt to use a conventional fast page mode DRAM interface with extended data output DRAMs. In other words, such DRAM interfaces may feed back active CASn as a latching signal. The performance of the EDO part may actually be worse than with a conventional part of similar speed when using such a feedback latching technique.

SUMMARY AND OBJECTS OF THE INVENTION

It is therefore an object of the present invention to improve peak and average bandwidth for an extended data output DRAM.

It is a further object of the present invention to provide a DRAM interface which optimizes the available data bandwidth for an extended data output DRAM.

BRIEF DESCRIPTIONS OF THE DRAWINGS

DETAILED DESCRIPTION OF THE INVENTION

Figure 2:
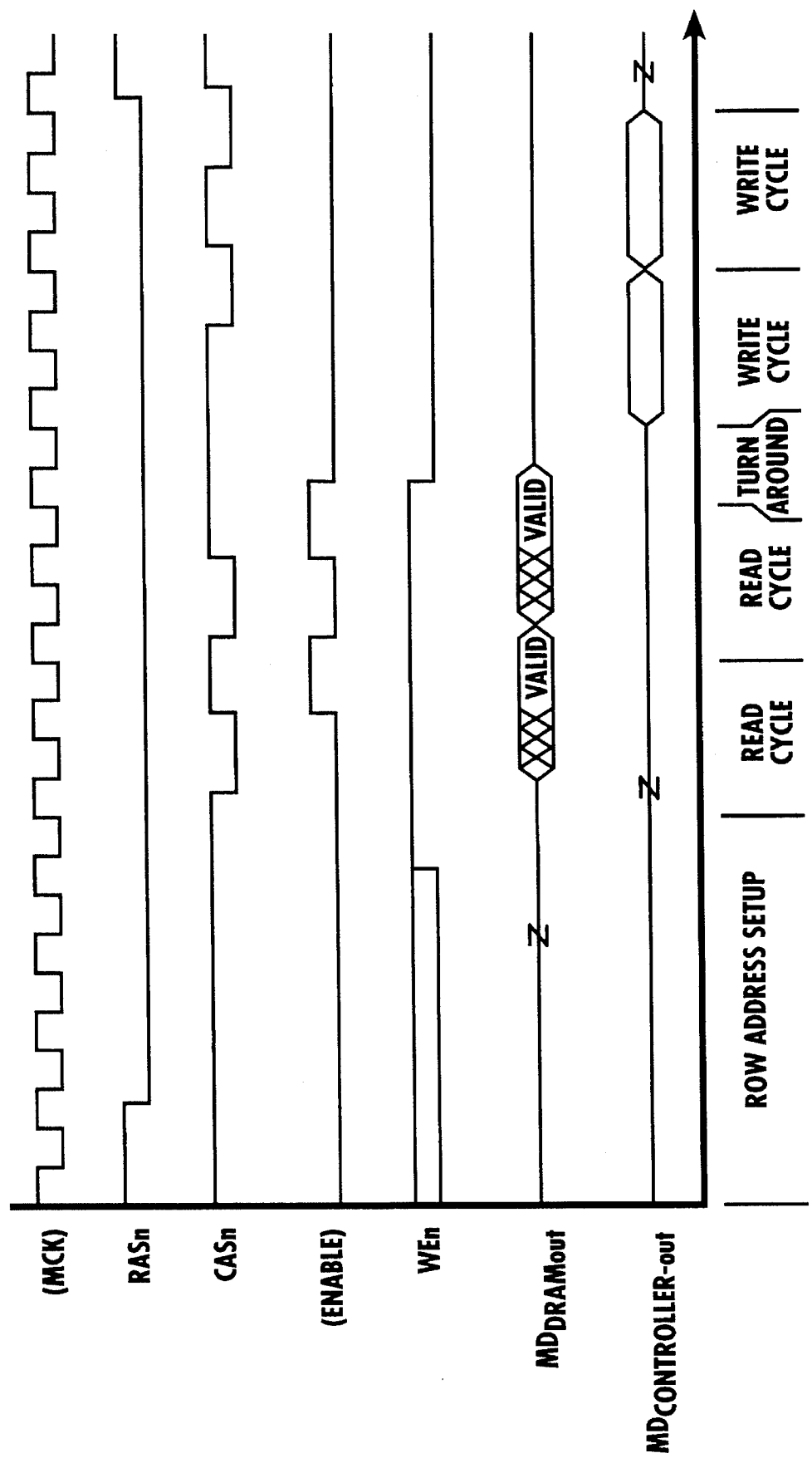
FIG. 2 is a timing diagram of an extended data output mode DRAM and DRAM interface of the present invention.
Figure 3:
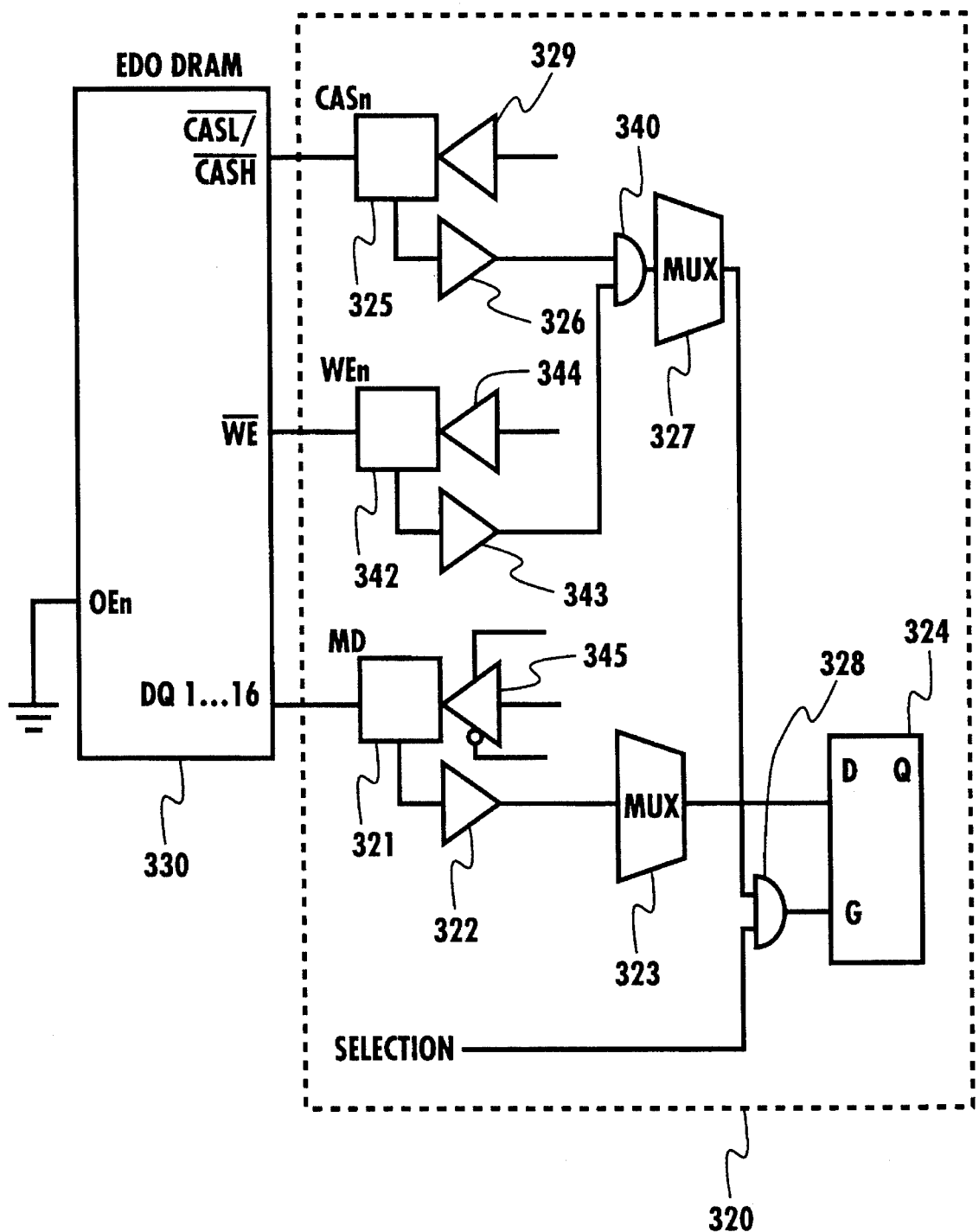
FIG. 3 is a schematic/block diagram of the extended data output DRAM and extended data output DRAM interface of the present invention.

FIG. 3 illustrates an extended data output DRAM 330 and extended data output DRAM interface 320 of the present invention. Extended data output DRAM 330 may differ from prior art extended data output DRAMs in that the functionality of the DRAM may be altered as illustrated in FIG. 2. If output enable pin OEn is connected to ground, then a read cycle may continue to drive MD until both CASn and RASn go inactive. In addition, when write enable signal goes active the output of extended data output DRAM 330 is deactivated as is illustrated in FIG. 2.

This change in the functionality of extended data output DRAM 330 allows DRAM interface 320 to use the fed-back inactive CASn signal, logically ANDed with a fed-back inactive WEn signal to form the write enable signal into transparent latch 324. One technique for optimizing the use of extended data output DRAM is to have the correct (valid) data on memory data bus for as short a time as is practical to latch it. If this technique is used, then the extended data output DRAM may be utilized to its maximum potential.

Figure 1A:
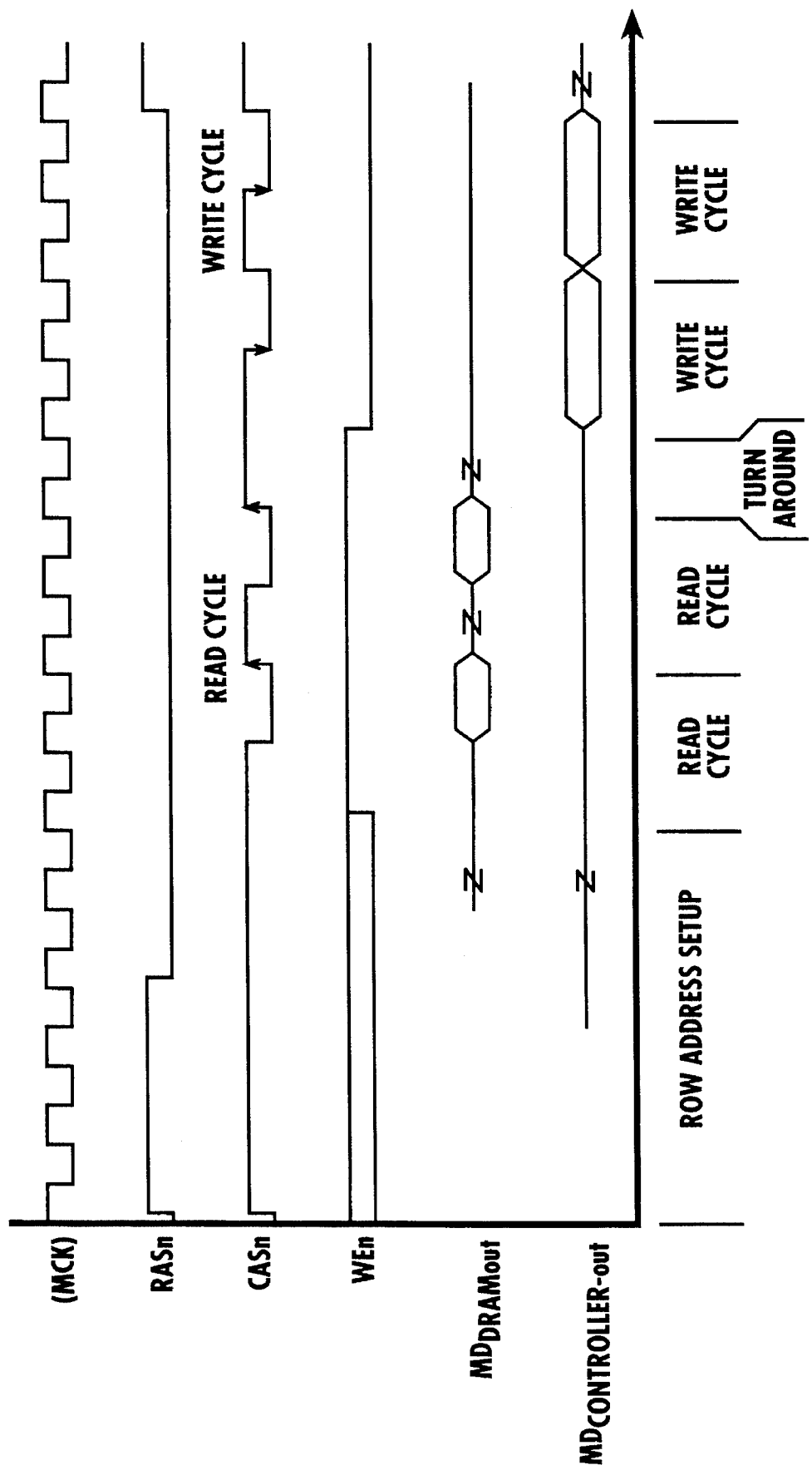
FIG. 1A is a timing diagram illustrating the operation of a prior art fast page DRAM and DRAM interface.
Figure 1B:
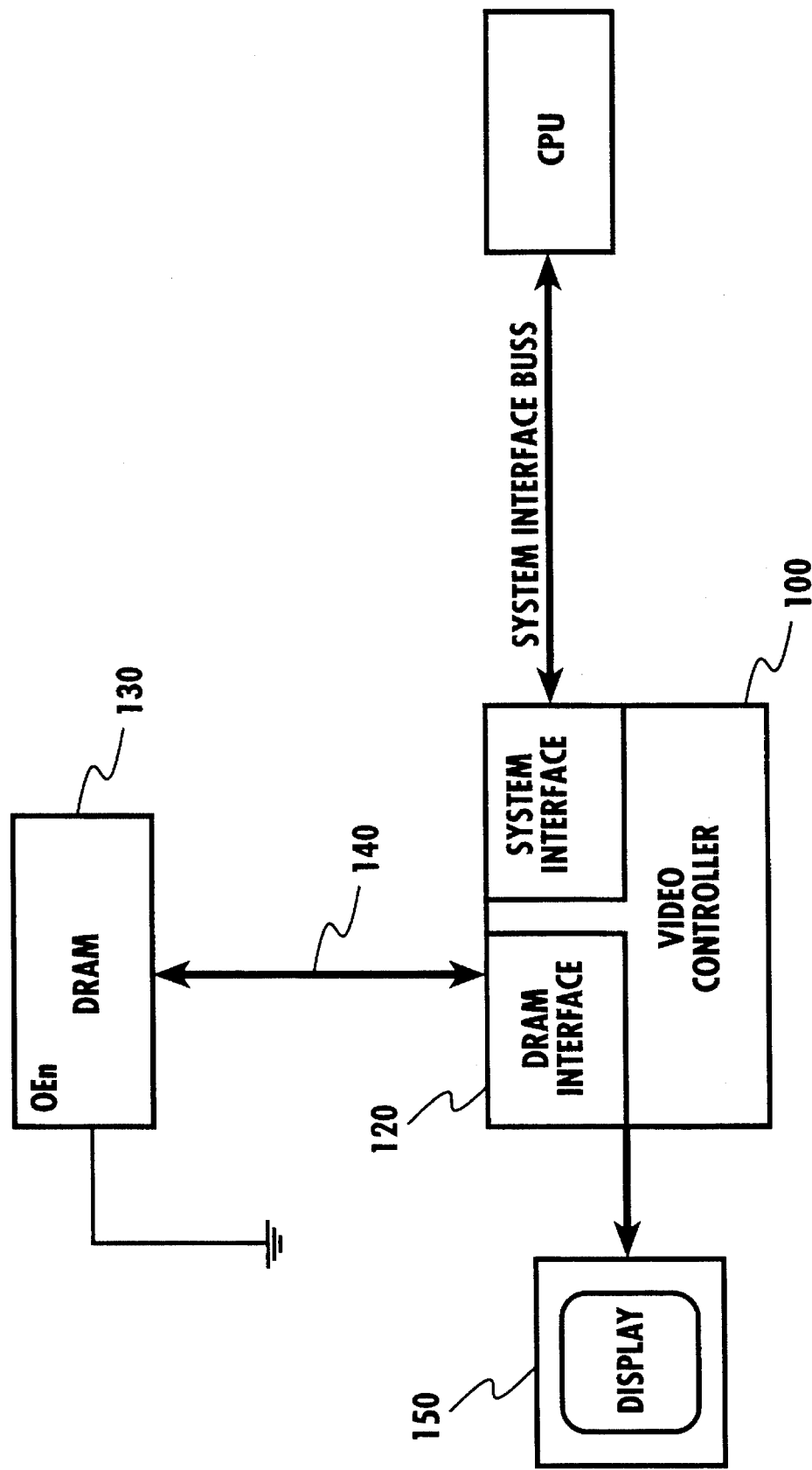
FIG. 1B is a block diagram of a prior art DRAM and DRAM interface as illustrated in a video controller.
Figure 1C:
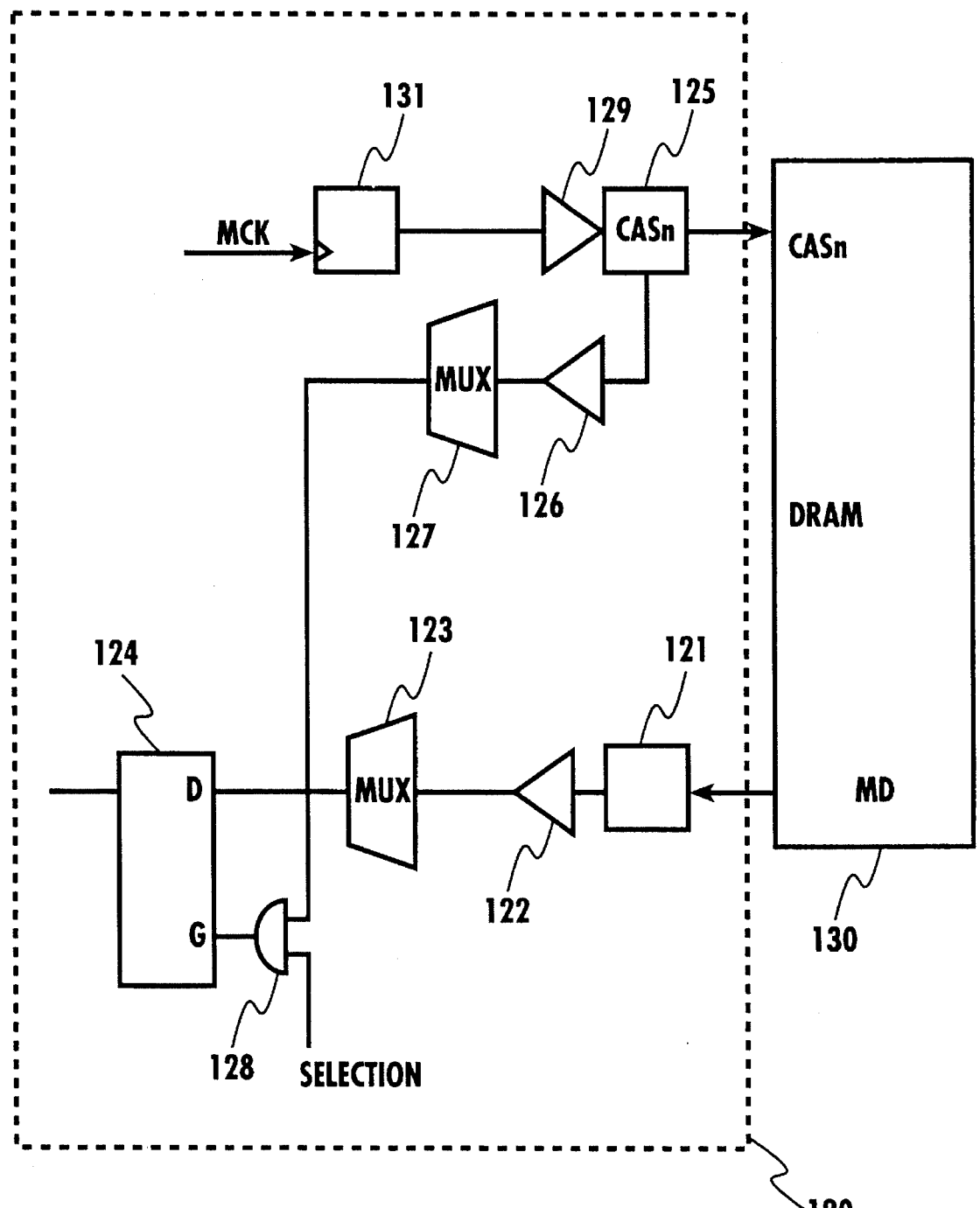
FIG. 1C is a schematic/block diagram illustrating details of the DRAM controller of FIG. 1B where the DRAM interface is a fast page mode DRAM interface.
Figure 1D:
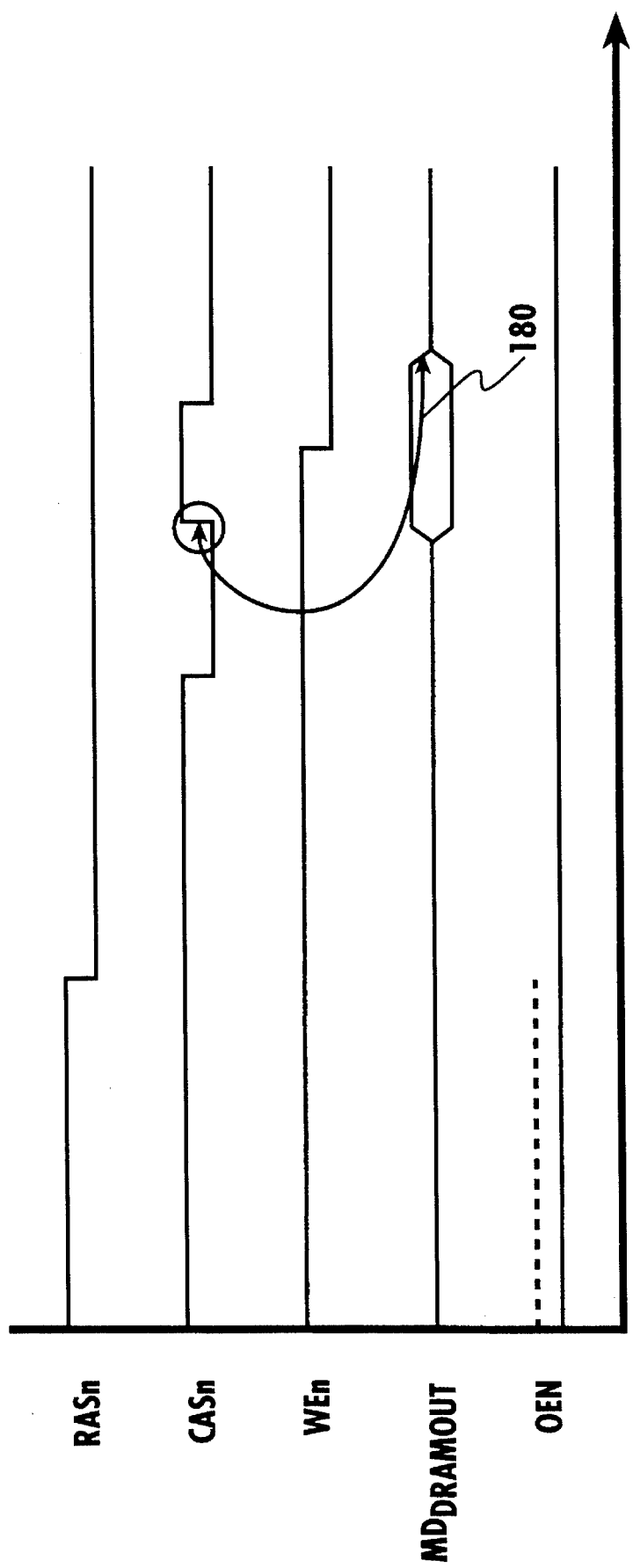
FIG. 1D is a detail of a timing diagram of FIG. 1A illustrating the operation of a fast page mode read cycle.
Figure 1E:
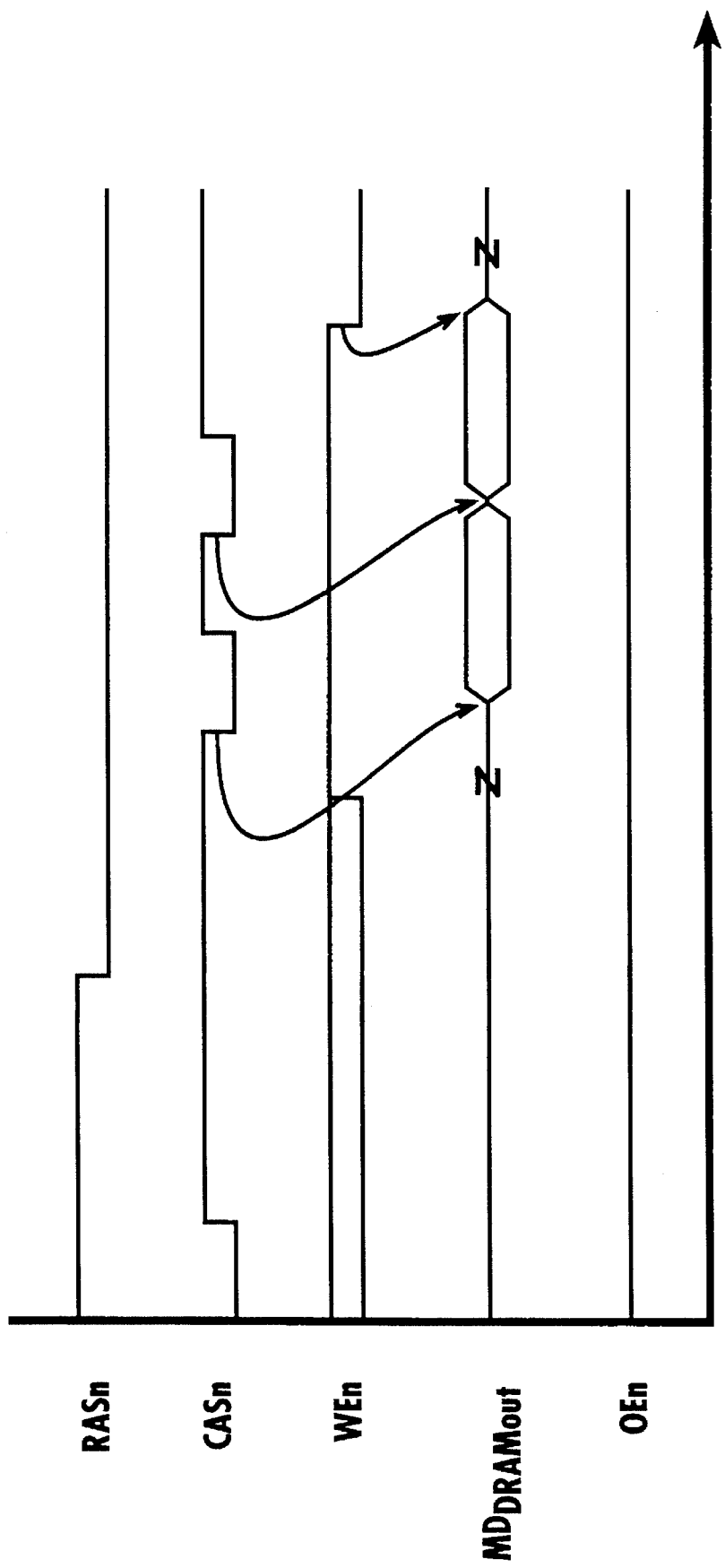
FIG. 1E is a detail of a timing diagram for an extended data output DRAM.

In a conventional DRAM, as illustrated in FIG. 1C, the active CASn signal is fed back to enable transparent latch 124 (the latch closes on the rising edge of fed-back signal CASn). In the present invention, the inactive CASn is fed-back within DRAM controller 320 (the latch closes on the next falling edge of fed-back CASn). When write cycles follow read cycles within the same DRAM page access (that is without an intervening Row Address and Row Address Strobe) the use of fed-back inactive CASn signal alone may not be sufficient to correctly latch data from extended data output DRAM 330.

As illustrated in the example waveform of FIG. 2 there may be two cases where read data being latched may use different events to close the latch receiving the data. The first case is a read cycle which is followed by another read cycle. In general, any number of read cycles may take place in this way. The first read cycle in the example is followed by another read cycle. The data from the first read cycle may become valid at some time just before the start of the second read cycle (which is at the second falling edge of CASn) and will remain valid for a Hold Time (which may be specified by the EDO DRAM manufacturer) after the start of the second read cycle. In this case the transparent latch may be enabled by the fed-back CASn signal so that the second falling edge of CASn (fed-back) closes the latch.

The second case is a read cycle which is followed by a write cycle. In this case it may not be desirable to wait for a subsequent CASn cycle to close the latch receiving the read cycle data because, by that time, data which is intended to be written to DRAM 330 will have been driven onto the Memory Data bus—thus obliterating the read cycle data.

In the embodiment of FIG. 3, write enable signal WEn is fed-back through pad 342 and input pad driver 343 and ANDed in AND gate 340. Column Address Strobe signal CASn is derived from memory clock MCK and generated in logic circuitry (not shown) within extended data output interface 320. Column address strobe signal CASn may be driven by output pad driver 329 through bi-directional pad 325 to extended data output DRAM 330. Column address strobe signal CASn may also be passed from bi-directional pad 325 through input pad driver 326 to emulate the signal delay in extended data output DRAM 330 and DRAM controller 320.

Similarly write enable signal WEn may be derived from the memory clock MCK and generated in logical circuitry (not shown) within extended data output DRAM interface 320. Write enable signal WEn may be driven by pad driver 344 through bi-directional pad 342 and output to extended data output DRAM 330.

Write enable signal WEn may also be passed from bi-directional pad 342 through input pad driver 343 to emulate signal delays in extended data output DRAM 330 and DRAM controller 320.

Fed-back signals CASn and WEn, suitably delayed, may then be ANDed together in AND gate 340 and passed through MUX 327 to produce signal ENABLE for enabling transparent latch 324. Signal ENABLE may then be ANDed with selection signal SELECTION in AND gate 328. Signal SELECTION may select a particular storage element (transparent latch 324) from a group of storage elements. For example, transparent latch 324 may comprise one element of a FIFO, for example a 28 level FIFO. The twenty-eight levels of the FIFO may need to be loaded sequentially, and signal SELECTION 14 may select a proper transparent latch 324 for a particular FIFO level.

Thus, as illustrated in FIG. 2, at the end of the first read cycle, CASn goes low, driving signal ENABLE low, closing transparent latch 324 and latching valid data from MD. At the end of the second read cycle, signal CASn may still be high.

However, signal WEn goes low, driving signal ENABLE low, closing transparent latch 324 and latching valid output data from MD. If only inactive CASn were used to latch output data from MD, data from the second read cycle might not be latched correctly.

As shown in FIG. 2, although data may be driven out of extended data output DRAM 330, the data may not always be valid. The XXX in signal MDDRAM$_{out}$ indicates data for which validity cannot be guaranteed. For different EDO DRAM (and conventional DRAM) manufacturers, there are specifications on when data will become valid from, for example, assertion of Column Address, assertion of Column Address Strobe CASn and the like.

These specifications may be used to infer a 'window' in time where data is valid. The window 'opens' at the latest access time specification from, for example, assertion of Column Address Strobe for the read cycle for which the data is being latched. The window 'closes' at the earliest hold time specification, for example, assertion of the column address strobe CASn for the next read cycle, or assertion of the Write Enable signal WEn. Extended data output DRAM 330 may be driving some data out before it may be considered valid. DRAM output onto memory data bus, as represented in FIG. 2 by signal MD$_{DRAMout}$, may not be tristate during that time, but rather be in an undefined state.

As illustrated in FIG. 2, signal ENABLE has a falling edge in each of the valid data windows which may serve to latch each data value in transparent latches 324. The fed-back falling edge of the second Column Address Strobe CASn causes the falling edge of the signal ENABLE which latches the valid data received in response to the first CASn strobe. Signal ENABLE may again be driven low by fed-back write enable signal WEn to latch valid data received in response to the second CASn strobe. Thus, while data from one column is being latched, the data from the next column is being accessed.

The SELECTION signal (which is not shown in FIG. 2) may also need to follow fed-back CASn timing in order to latch read data reliably.

In general the SELECTION signal for a particular latch 324 may be removed, and a SELECTION signal for a subsequent latch 324 asserted, at the moment when the ENABLE signal loading the first latch ends.

The timing diagram of FIG. 2 is for purposes of illustration only and is intended in no way to limit the spirit or scope of the invention. For example, most page mode memory access cycles may presumably have more than two read or write cycles in order to better amortize row select overhead and increase average bandwidth.

While the preferred embodiment and various alternative embodiments of the invention have been disclosed and described in detail herein, it may be apparent to those skilled in the art that various changes in form and detail may be made therein without departing from the spirit and scope thereof.

What is claimed is:

1. A memory interface comprising:

a first output means for outputting a column select signal to a memory;

a second output means for outputting a write enable signal to the memory;

data input means, for receiving data from the memory in response to at least said column select signal and said write enable signal; and data latching means, coupled to said data input means, said first output means and said second output means, for latching said data in response to a latching signal;

wherein said latching signal comprises said column select signal combined with said write enable signal.

2. The memory interface of claim 1, further comprising:

first feedback means, coupled to said first output means, for feeding back said column select signal to said data latching means, said first feedback means delaying said column select signal by an amount of time so as to emulate delays within said memory interface and the memory.

3. The memory interface of claim 2, further comprising:

second feedback means, coupled to said second output means, for feeding back said write enable signal to said data latching means, said second feedback means delaying said write enable signal by an amount of time so as to emulate delays within said memory interface and the memory.

4. The memory interface of claim 1, further comprising:

a first AND gate for combining said write enable signal and said column select signal to produce said latching signal.

5. The memory interface of claim 4, further comprising:

a second AND gate for combining said latching signal with a selection signal for selecting a latch among a group of latches in said data latching means.

6. The memory interface of claim 4, wherein the memory comprises an extended data output memory.

7. A method of reading data from an extended data output memory to a memory interface, comprising the steps of:

outputting an inactive write enable signal from the memory interface to the extended data output memory, outputting a row address signal from the memory interface to the extended data output memory, outputting a column address signal from the memory interface to the extended data output memory, combining the write enable signal and the column select signal to form a latching signal, receiving output data from the extended data output memory in the memory controller, and latching the output data from the extended data output memory in the memory interface in response to the latching signal.

8. The method of claim 7, wherein said step of outputting an inactive write enable signal from the memory interface to the extended data output memory comprises the steps of:

generating an inactive write enable signal in the memory interface indicative of a read operation to be performed in the extended data output memory, and outputting the inactive write enable signal from the memory interface to the extended data output memory.

9. The method of claim 7, wherein the step of outputting a row address signal from the memory interface to the extended data output memory comprises the steps of:

generating a row address in the memory interface, outputting the row address from the memory interface to the extended data output memory, generating a row select signal in the memory interface indicative of the validity of a row address signal, and outputting the row select signal from the memory interface to the extended data output memory.

10. The method of claim 7, wherein said step of outputting a column address signal from the memory interface to the extended data output memory comprises the steps of:

generating a column address in the memory interface, outputting the column address from the memory interface to the extended data output memory, generating a column select signal in the memory interface indicative of the validity of a column address signal, and outputting the column select signal from the memory interface to the extended data output memory.

11. The method of claim 7, further comprising the step of:

feeding back the write enable signal from an output of the memory interface for combination as a latching signal so as to emulate delays within the extended data output memory and the memory interface.

12. The method of claim 7, further comprising the step of:

feeding back the column select signal from an output of the memory interface for combination as a latching signal so as to emulate delays within the extended data output memory and the memory interface.

13. A video controller integrated circuit for use with an extended data output video memory, said video controller integrated circuit comprising:

a column select output pad for outputting a column select signal to the extended data output video memory;

a write enable output pad for outputting a write enable signal to the extended data output video memory;

a video memory data input pad, for receiving data from the extended data output video memory in response to at least said column select signal and said write enable signal; and data latching means, coupled to said video memory data input pad, said column select output pad and said write enable output pad, for latching said data in response to a latching signal;

wherein said latching signal comprises said column select signal combined with said write enable signal.

14. The video controller integrated circuit of claim 13, further comprising:

first feedback means, coupled to said column select output pad, for feeding back said column select signal to said data latching means, said first feedback means delaying said column select signal by an amount of time so as to emulate delays within said video controller integrated circuit and the extended data output video memory.

15. The video controller integrated circuit of claim 14, further comprising:

second feedback means, coupled to said write enable output pad, for feeding back said write enable signal to said data latching means, said second feedback means delaying said write enable signal by an amount of time so as to emulate delays within said video controller integrated circuit and the extended data output video memory.

16. The video controller integrated circuit of claim 13, further comprising:

a first AND gate for combining said write enable signal and said column select signal to produce said latching signal.

17. The video controller integrated circuit of claim 16, further comprising:

a second AND gate for combining said latching signal with a selection signal for selecting a latch among a group of latches in said data latching means.

* * * * *